United States Patent
Bordelon et al.

(10) Patent No.: US 9,418,856 B2
(45) Date of Patent: Aug. 16, 2016

(54) METHODS OF FORMING TITANIUM-ALUMINUM LAYERS FOR GATE ELECTRODES AND RELATED SEMICONDUCTOR DEVICES

(71) Applicant: Samsung Electronics Co., Ltd., Suwon-si (KR)

(72) Inventors: Clint E. Bordelon, Bastrop, TX (US); David J. Williams, Pflugerville, TX (US); Sergei Drizlikh, Cedar Park, TX (US); Jun-Han Kim, Bucheon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/595,514

(22) Filed: Jan. 13, 2015

(65) Prior Publication Data

US 2016/0133470 A1 May 12, 2016

Related U.S. Application Data

(60) Provisional application No. 62/076,225, filed on Nov. 6, 2014.

(51) Int. Cl.
*H01L 21/3205* (2006.01)
*H01L 21/4763* (2006.01)
*H01L 21/288* (2006.01)
*H01L 21/324* (2006.01)
*H01L 21/283* (2006.01)

(52) U.S. Cl.
CPC ............ *H01L 21/288* (2013.01); *H01L 21/283* (2013.01); *H01L 21/324* (2013.01)

(58) Field of Classification Search
None
See application file for complete search history.

(56) References Cited

U.S. PATENT DOCUMENTS

| | | |
|---|---|---|
| 5,693,564 A | 12/1997 | Yu |
| 6,258,466 B1 | 7/2001 | McTeer |
| 7,375,024 B2 | 5/2008 | Park |
| 8,623,759 B2 | 1/2014 | Kansaku |
| 2010/0184286 A1 | 7/2010 | Kansaku |
| 2011/0097897 A1 | 4/2011 | Tanaka |
| 2013/0224927 A1 | 8/2013 | Schmidbauer et al. |

FOREIGN PATENT DOCUMENTS

EP 0788145 A2 8/1997

*Primary Examiner* — William F Kraig
*Assistant Examiner* — Stanetta Isaac
(74) *Attorney, Agent, or Firm* — Myers Bigel Sibley, P.A.

(57) ABSTRACT

Methods of forming a semiconductor device are provided in which a first titanium-aluminum layer is formed in a recess. A first titanium layer is formed in the recess on top of the first titanium-aluminum layer. A first aluminum layer is formed in the recess on top of the first titanium layer to form a first preliminary gate electrode structure in the recess. The first preliminary gate electrode structure is heated to a temperature sufficient to convert the first titanium-aluminum layer, the first titanium layer and at least some of the first aluminum layer into a second titanium-aluminum layer. A second titanium layer is formed on top of the second titanium-aluminum layer. A second aluminum layer that is thicker than the first aluminum layer is then formed on top of the second titanium layer. The structure is heated to a temperature sufficient to convert the second titanium-aluminum layer, the second titanium layer and the second aluminum layer to a final third titanium-aluminum layer and final gate structure.

17 Claims, 7 Drawing Sheets

METHODS OF FORMING TITANIUM-ALUMINUM LAYERS FOR GATE ELECTRODES AND RELATED SEMICONDUCTOR DEVICES

CROSS-REFERENCE TO RELATED APPLICATION

The present application claims priority under 35 U.S.C. §120 to U.S. Provisional Application Ser. No. 62/076,225, filed on Nov. 6, 2014, the entire content of which is incorporated herein by reference as if set forth in its entirety.

FIELD

The inventive concepts generally relate to semiconductor devices and, more particularly, to methods of forming gate electrodes for semiconductor devices.

BACKGROUND

Semiconductor transistors are a basic building block of today's integrated circuits. Such transistors are typically formed in conventional bulk semiconductor substrates (such as silicon) or in a semiconductor layer of a semiconductor-on-insulator (SOI) substrate. As integrated circuits such as memory circuits, logic circuits and the like are formed to have higher and higher integration density, the size of various structures of field effect transistors (FETs), such as metal-oxide-semiconductor field effect transistors (MOSFETs) and complementary metal oxide semiconductors (CMOS), are being reduced. Such down-scaling of these devices achieves compactness and may improve operating performance by reducing the overall dimensions of the device. However, such down-scaling may also make the transistors more susceptible to electrical failures as processing margins are reduced.

SUMMARY

Methods of forming a semiconductor device are provided in which a first titanium-aluminum layer is formed in a recess. A first titanium layer is formed in the recess on top of the first titanium-aluminum layer. A first aluminum layer is formed in the recess on top of the first titanium layer to form a first preliminary gate electrode structure in the recess. The first preliminary gate electrode structure is heated to a temperature sufficient to convert the first titanium-aluminum layer, the first titanium layer and at least some of the first aluminum layer into a second titanium-aluminum layer. A second aluminum layer that is thicker than the first aluminum layer is then formed on top of the second titanium-aluminum layer to form a second preliminary gate electrode structure.

In some embodiments, a second titanium layer may be formed in the recess on top of the second titanium-aluminum layer prior to forming the second aluminum layer. This second titanium layer may substantially fill a remainder of the recess. The method of claim 3, In such embodiment, the second preliminary gate electrode structure may be heated to convert the second titanium-aluminum layer, any remaining portion of the first aluminum layer, the second titanium layer and a lower portion of the second aluminum layer into a third titanium-aluminum layer to convert the second preliminary gate electrode structure into a gate electrode structure. In such embodiments, the recess may be a recess in an insulation layer, and the entirety of an upper surface of the third titanium-aluminum layer may be at a height above an underlying substrate that exceeds a maximum height of the insulation layer above the underlying substrate.

In some embodiments, heating the first preliminary gate electrode structure to the temperature sufficient to convert the first titanium-aluminum layer, the first titanium layer and at least some of the first aluminum layer into a second titanium-aluminum layer may only convert the first titanium-aluminum layer, the first titanium layer and a lower portion of the first aluminum layer that is adjacent the first titanium layer into the second titanium-aluminum layer. The first titanium layer may be formed directly on an upper surface of the first titanium-aluminum layer, the first aluminum layer may be formed directly on an upper surface of the first titanium layer, the second titanium layer may be formed directly on an upper surface of the remaining portion of the first aluminum layer, and the second aluminum layer may be formed directly on an upper surface of the second titanium layer.

In some embodiments, a dielectric layer may be formed in the recess that has a dielectric constant that exceeds a dielectric constant of silicon oxide prior to forming the first titanium-aluminum layer in the recess. In such embodiments, after the dielectric layer is formed, a remainder of the recess may define an opening having a length in a first direction that is parallel to an upper surface of an underlying substrate that is as small as 20 nm. In such embodiments, the opening may have a depth in a second direction that is parallel to the first direction and perpendicular to the upper surface of the substrate that is at least twice the length.

In some embodiments, the first aluminum layer may have a thickness that is no more than three times greater than a thickness of the first titanium layer. In other embodiments, the first aluminum layer may have a thickness that is between two and four times greater than a thickness of the first titanium layer, and the second titanium layer may have a thickness that is less than the thickness of the first titanium layer.

In some embodiments, the first titanium-aluminum layer, the first titanium layer and the first aluminum layer may each be formed via sputtering.

In some embodiments, within the recess, a concentration of titanium in the third titanium-aluminum layer may be substantially uniform at each distance from a top surface of the dielectric layer. In such embodiments, within the recess, the concentration of titanium in the third titanium-aluminum layer may vary as a function of distance from the top surface of the dielectric layer.

Pursuant to further embodiments of the inventive concepts, methods of forming a semiconductor device in which a first titanium layer is formed in a recess in an underlying layer structure having at least one layer. A first aluminum layer is formed in the recess on an upper surface of the first titanium layer to form a first preliminary gate electrode structure, the first aluminum layer having a thickness that is less than three times a thickness of the first titanium layer. The first preliminary gate electrode structure is heated to a temperature sufficient to convert the first titanium layer and at least a lower portion of the first aluminum layer into a second titanium-aluminum layer. A second aluminum layer that is thicker than the first aluminum layer is formed on the second titanium-aluminum layer to form a second preliminary gate electrode structure.

In some embodiments, the second preliminary gate structure may be heated to convert the second titanium-aluminum layer, any remaining portion of the first aluminum layer, and a lower portion of the second aluminum layer into a third titanium-aluminum layer. In such embodiments, a first titanium-aluminum layer may be formed in the recess prior to forming the first titanium layer. This first titanium-aluminum layer may comprise part of the first preliminary gate electrode structure and may be converted during the heating of the first preliminary gate electrode structure into part of the second titanium-aluminum layer.

In some embodiments, only a lower portion of the first aluminum layer may be converted into the second titanium-aluminum layer, and a second titanium layer may be formed in the recess on an upper surface of the upper portion of the first aluminum layer after the heating of the first preliminary gate electrode but prior to the formation of the second aluminum layer, the second titanium layer comprising part of the second preliminary gate electrode structure. The second preliminary gate electrode structure may be heated to convert the second titanium-aluminum layer, the upper portion of the first aluminum layer, and a lower portion of the second aluminum layer into a third titanium-aluminum layer.

In some embodiments, a first titanium-aluminum layer may be in the recess prior to forming the first titanium layer. This first titanium-aluminum layer may be part of the first preliminary gate electrode structure and may be converted during the heating of the first preliminary gate electrode structure into part of the second titanium-aluminum layer. The first titanium layer may be formed directly on an upper surface of the first titanium-aluminum layer, the first aluminum layer may be formed directly on an upper surface of the first titanium layer, the second titanium layer may be formed directly on an upper surface of the upper portion of the first aluminum layer, and the second aluminum layer may be formed directly on an upper surface of the second titanium layer. Moreover, the second titanium layer may be formed to substantially fill a remainder of the recess.

In some embodiments, the first titanium layer may have a thickness of less than 120 Angstroms, the first aluminum layer may have a thickness of less than 360 Angstroms, and the second aluminum layer may have a thickness that exceeds 800 Angstroms. Within the recess, a concentration of titanium in the third titanium-aluminum layer may substantially uniform at each distance from a top surface of the underlying layer structure.

Pursuant to still further embodiments of the present invention, methods of forming a semiconductor device are provided in which a first titanium layer that has a thickness of less than 120 Angstroms is formed in a recess in an underlying layer structure having at least one layer. A first aluminum layer having a thickness of less than 360 Angstroms is formed in the recess on an upper surface of the first titanium layer. A second titanium layer having a thickness of less than 80 Angstroms is formed in the recess on an upper surface of the first aluminum layer to form a first preliminary gate electrode structure. The first preliminary gate electrode structure is heated to a temperature sufficient to convert the first titanium layer, the first aluminum layer and a lower portion of the second titanium layer into a second titanium-aluminum layer. A second aluminum layer that is thicker than the first aluminum layer is formed on the second titanium-aluminum layer to form a second preliminary gate and the second titanium layer structure.

In some embodiments, the second preliminary gate electrode structure may be heated to convert the second titanium-aluminum layer, an upper portion of the second titanium layer and a lower portion of the second aluminum layer into a third titanium-aluminum layer. A first titanium-aluminum layer may be formed in the recess prior to forming the first titanium layer. The recess may be a recess in an insulation layer, and the entirety of an upper surface of the third titanium-aluminum layer may be at a height above an underlying substrate that exceeds a maximum height of the insulation layer above the underlying substrate.

In some embodiments, a dielectric layer may be formed in the recess that has a dielectric constant that exceeds a dielectric constant of silicon oxide prior to forming the first titanium-aluminum layer in the recess. After the dielectric layer is formed in the recess, a remainder of the recess may define an opening having a length in a first direction that is parallel to an upper surface of an underlying substrate that is less than about 20 nm. The opening may have a depth in a second direction that is parallel to the first direction and perpendicular to the upper surface of the substrate, where the depth may be at least twice the length.

In some embodiments, the first aluminum layer may have a thickness that is, less than four times greater than a thickness of the first titanium layer.

Pursuant to still further embodiments of the inventive concepts, semiconductor devices are provided that include a substrate; an insulation layer on a top surface of the substrate, the insulation layer having a top surface with a recess therein; a dielectric pattern in the recess that has a dielectric constant that exceeds a dielectric constant of silicon oxide; a titanium-aluminum pattern that fills the recess; and an aluminum pattern on the titanium aluminum pattern, the titanium-aluminum pattern and the aluminum pattern together forming a gate electrode. A portion of the gate electrode that is in the recess has a length in a first direction that is parallel to the top surface of the substrate that is less than about 20 nmnm.

In some embodiments, a titanium nitride pattern may be provided between the dielectric pattern and the titanium-aluminum pattern. The titanium-aluminum pattern may have a depth in a second direction that is parallel to the first direction and perpendicular to the upper surface of the substrate, wherein a depth-to-length ratio is at least 2:1

In some embodiments, within the recess, a concentration of titanium in the titanium-aluminum pattern may be substantially uniform at each distance from a top surface of the dielectric pattern. In such embodiments, the concentration of titanium in the titanium-aluminum pattern may vary as a function of distance from the top surface of the dielectric pattern. The titanium-aluminum pattern may have a first titanium concentration at a first distance from the top surface of the dielectric pattern, a second titanium concentration at a second distance from the top surface of the dielectric pattern, a third titanium concentration at a third distance from the top surface of the dielectric pattern, and a fourth titanium concentration at a fourth distance from the top surface of the dielectric pattern, where the fourth distance is greater than the third distance, the third distance is greater than the second distance and the second distance is greater than the first distance, and where the second concentration and the fourth concentration exceed both the first concentration and the third concentration.

DETAILED DESCRIPTION

Pursuant to embodiments of the inventive concepts, methods of forming semiconductor devices that have uniform titanium-aluminum layers that are formed in small and/or high aspect ratio recesses are provided. These uniform titanium-aluminum layers may be included, for example, in the gate structures of various MOSFET and CMOS devices having aluminum gates that are formed using "gate-last" processing technologies.

In conventional MOSFET and CMOS fabrication approaches, a sacrificial gate structure may be removed to form a recess in an insulating layer. In some of these devices, a titanium-aluminum layer followed by a titanium wetting layer may be formed in the recess, and then a bulk aluminum gate may be deposited in and above the recess. These metal layers may form the gate electrode of the semiconductor device. The titanium-aluminum layer may facilitate work function tuning for the device.

As FET devices are scaled down in size (e.g., to 20 nm technology and smaller), conventional plasma vapor phase deposition ("PVD") and radio frequency plasma vapor deposition ("RF PVD") techniques may not effectively fill narrow recesses such as the recesses formed when sacrificial gate structures are removed. This is particularly true if the recesses have relatively high aspect ratios such as length-to-depth aspect ratios of 2-to-1 or more. Because of these limitations, sputtered aluminum may not effectively fill such recesses with sufficient consistency, and titanium-aluminum also cannot be sputtered to fill the recess due to pinch-off at the top of the recess that again may prevent the recess from being completely filled.

In order to form an aluminum gate electrode structure in these devices, in conventional technologies, a first titanium-aluminum layer is formed on the bottom and sidewalls of the gate recess, and then a titanium wetting layer is sputtered onto the first titanium-aluminum layer. A bulk aluminum layer is then deposited on the titanium wetting layer to fill the remainder of the recess and is also deposited on the upper surface of the device. The device is then annealed to reflow the metal layers. During this annealing step, atoms in the first titanium-aluminum layer, in the titanium wetting layer and in the initially deposited portion of the bulk aluminum layer intermix to convert the first titanium-aluminum layer, the titanium wetting layer and part of the bulk aluminum layer into a second titanium-aluminum layer.

Unfortunately, when the above-described fabrication technique is used, the second titanium-aluminum layer may have a non-uniform composition as the titanium may agglomerate in certain areas. When this occurs, portions of the second titanium-aluminum layer may be very thin (due to titanium agglomeration), and this may allow pure or nearly pure aluminum to diffuse through the second titanium-aluminum layer into an underlying insulating layer that serves as a gate dielectric layer during subsequent processing steps and thermal cycling. The diffused aluminum can lead to premature breakdown of the dielectric layer, which may reduce the breakdown voltage of the device and/or increase the variability of the threshold voltage.

Pursuant to embodiments of the inventive concepts, methods of forming semiconductor devices that have uniform titanium-aluminum layers that are formed, for example, in gate recesses are provided. These uniform titanium-aluminum layers may be formed, for example, by sequentially forming a first titanium-aluminum layer, a first titanium layer and a thin first aluminum layer in the recess and then annealing the device (before depositing a bulk aluminum layer) to convert the first titanium-aluminum layer, the first titanium layer and at least part of the first aluminum layer into a second titanium-aluminum layer. By only depositing a thin aluminum layer before the annealing step, the second titanium-aluminum layer that is formed during the anneal may be formed in an "aluminum starvation mode" since the thickness of the first aluminum layer may be less than a thickness that is necessary to achieve the natural 1:3 titanium-to-aluminum ratio. As a result, the titanium-aluminum reaction may be forced to occur laterally along the boundary between the thin titanium and aluminum layers instead of pluming into a thick bulk aluminum layer that can supply essentially unlimited amounts of aluminum to the reaction along a path of minimum energy that exists between the aluminum grain boundaries. As a result, a more uniform titanium-aluminum layer may be formed without diffusion of pure or near-pure aluminum into an underlying gate dielectric layer.

In some embodiments, only a lower portion of the thin first aluminum layer will be converted into titanium-aluminum and thus, after the anneal, a thin aluminum layer may remain on the second titanium-aluminum layer. In some embodiments, a thin titanium capping layer may be deposited on this thin aluminum layer, and then the device may be heated again to reflow the aluminum and titanium to convert the second titanium-aluminum layer, the thin aluminum layer and the titanium capping layer into a third titanium-aluminum layer. The bulk aluminum layer may then be deposited and reflowed to complete the fabrication of the gate electrode.

Test results indicate that the methods according to embodiments of the inventive concepts may provide more uniform titanium-aluminum layers that may significantly reduce the likelihood of device failure. In particular, breakdown tests indicate that devices fabricated according to embodiments of the inventive concepts may consistently maintain significantly higher breakdown voltages, and may also exhibit more uniform threshold voltages. As a result, the methods according to embodiments of the inventive concepts may provide semiconductor devices that exhibit improved performance and/or that have improved production yields.

Methods and devices according to embodiments of the inventive concepts will now be discussed in more detail with reference to the attached drawings, in which example embodiments of these methods and semiconductor devices and intermediate structures are shown. Before discussing these embodiments, a conventional method of fabricating a gate electrode will be discussed with reference to FIGS. 1A-1D.

Figure 1A:
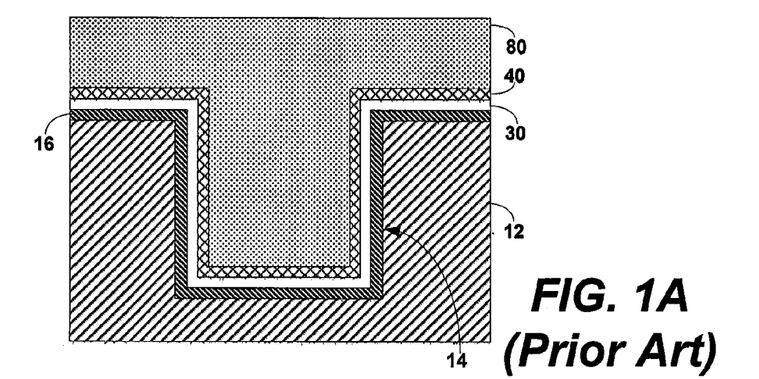
FIGS. 1A and 1B are schematic cross-sectional diagrams illustrating the fabrication of a gate electrode of a semiconductor transistor according to conventional techniques.

Referring to FIG. 1A, an insulation layer 12 may have a recess 14 formed therein. One or more layers such as, for example, a high-k dielectric layer 16, may be formed in the recess 14. A first titanium-aluminum layer 30 is formed in the recess 14 on the high-k dielectric layer 16. The first titanium-aluminum layer 30 may be deposited, for example, via sputtering. A thin titanium wetting layer 40 is then deposited on the first titanium-aluminum layer 30 via sputtering. A bulk aluminum layer 80 is then deposited to fill the recess 14 and is also deposited above the recess 14. The bulk aluminum layer 80 may be formed using a damascene deposition process and may be planarized to a desired height.

Figure 1B:
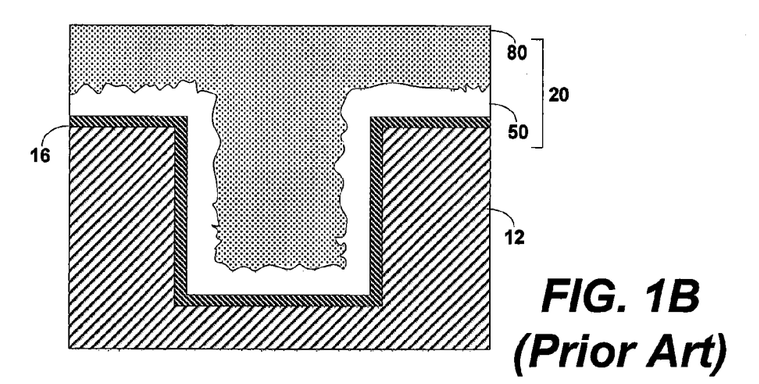

Referring to FIG. 1B, an annealing process may then be performed to melt the bulk aluminum 80 so that the bulk aluminum 80 will reflow to more completely fill the recess 14. During this annealing process, the titanium wetting layer 40 and a lower portion of the bulk aluminum layer 80 may intermix to convert the titanium wetting layer 40 and a lower portion of the bulk aluminum layer 80 into titanium-aluminum. Accordingly, the annealing process may convert the first titanium-aluminum layer 30, the titanium wetting layer 40 and a lower portion of the bulk aluminum layer 80 into a second titanium-aluminum layer 50. The second titanium-aluminum layer 50 and the bulk aluminum layer 80 may together form a gate electrode 20 for a semiconductor device.

Figure 1C:
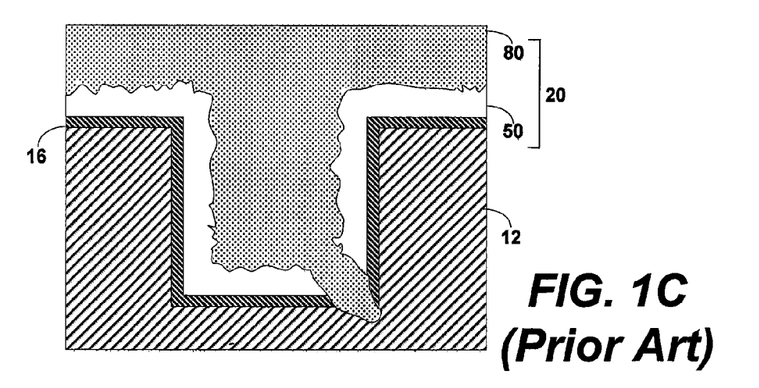
FIG. 1C is a schematic cross-sectional diagram of a gate electrode of a conventional semiconductor transistor that illustrates how aluminum may diffuse into the gate dielectric layer.

It has been discovered that problems may arise in some percentage of devices manufactured using the above-described process because the second titanium-aluminum layer 50 may have non-uniform titanium and aluminum concentrations. The first titanium-aluminum layer 30 is formed by sputtering, which tends to form a layer having approximately equal numbers of titanium and aluminum atoms, as opposed to a desired $TiAl_3$ composition. The second titanium-aluminum layer 50 is formed by a diffusion process between the first titanium-aluminum layer 30, the titanium wetting layer 40 and the bulk aluminum layer 80 during the anneal. Because the bulk aluminum layer 80 is very thick, aluminum from the bulk aluminum layer 80 may flow into and even through the titanium wetting layer 40 along the path of minimum energy that exists between aluminum grain boundaries. The titanium in the titanium wetting layer 40 may also form plumes into a lower portion of the bulk aluminum layer 80. As a result, after the anneal, the second titanium-aluminum layer 50 may have non-uniform concentrations of aluminum and titanium so that relatively thick titanium-rich regions may form that are separated by thinner aluminum-rich regions. As schematically shown in FIG. 1C, in same cases, aluminum may diffuse through an aluminum-rich region of the second titanium-aluminum layer 50 into, and even through, the underlying high-k dielectric layer 16. When this occurs, the breakdown voltage of the device may be significantly reduced and the threshold voltage of the transistor may be increased.

Figure 1D:
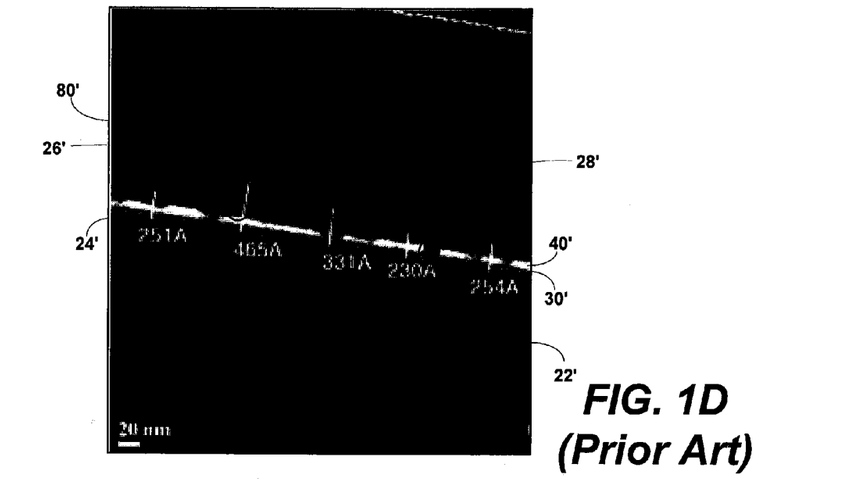
FIG. 1D is a TEM photograph illustrating a non-uniform titanium-aluminum layer fabricated using conventional techniques.

FIG. 1D is a TEM photograph of a titanium-aluminum layer that was formed on a substrate using conventional processing techniques. In the example of FIG. 1D, a tantalum-nitride barrier layer 24' was formed on a silicon substrate 22'. A titanium-aluminum layer 30' was formed on the tantalum-nitride barrier layer 24'. A titanium wetting layer 40' was formed on the titanium aluminum layer 30', and then a bulk aluminum layer 80' was deposited on the titanium wetting layer 40'. The substrate was then annealed, and the TEM image of FIG. 1D was taken of the resulting structure. In the TEM image of FIG. 1D, the white regions represent titanium-rich regions of the titanium-aluminum layer 30', the black regions are the silicon substrate 22', the tantalum-nitride barrier layer 24', and the bulk aluminum layer 80', and the grey regions are portions of the titanium-aluminum layer 30' that are less rich in titanium.

As can be seen in FIG. 1D, when conventional techniques are used, plumes of titanium 26' may extend well above the upper surface of the original titanium wetting layer 40'. Between these plumes 26', there may be regions 28' having reduced titanium concentrations, which appear as breaks in the titanium-aluminum layer 30'. These breaks 28' are areas where aluminum has diffused through the titanium-aluminum layer 30'. As will be discussed in greater detail herein, diffusion of aluminum into the high-k gate dielectric layer may significantly reduce the breakdown voltage of the device and may also increase the threshold voltage of the device.

Figure 2:
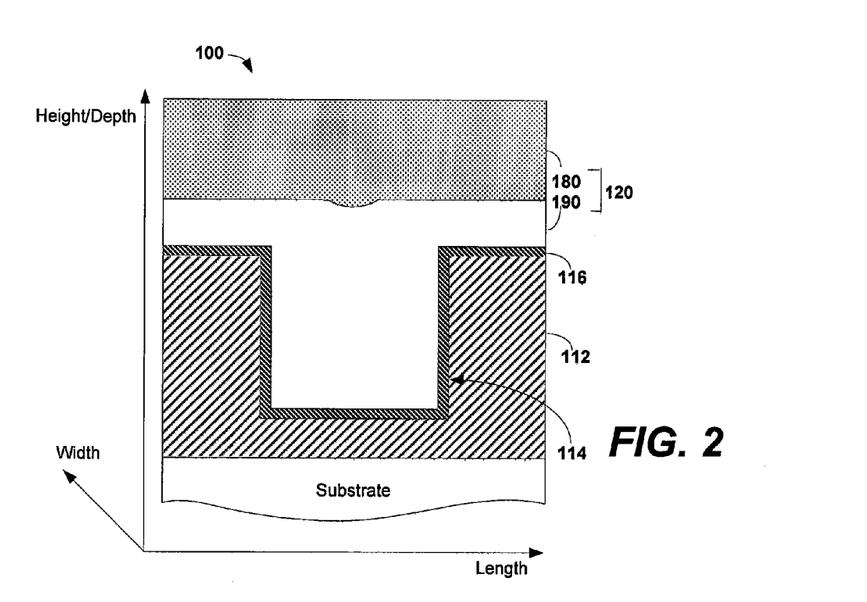
FIG. 2 is a schematic cross-sectional diagram of a gate electrode of a semiconductor device according to certain embodiments of the inventive concepts.

FIG. 2 is a schematic cross-sectional diagram of a gate electrode structure 120 of a semiconductor device 100 according to certain embodiments of the inventive concepts. As shown in FIG. 2, the semiconductor device 100 includes an insulation layer 112 that has a gate recess 114 formed therein. A high-k gate dielectric layer 116 may be formed in the recess 114. Additionally, one or more initial gate layers (not shown) may also be formed in the recess on the high-k gate dielectric layer 116 such as, for example, a barrier layer. A uniform titanium-aluminum layer 190 is provided in the recess 114 on the high-k gate dielectric layer 116. A bulk aluminum layer 180 is formed on the titanium-aluminum layer 190. The bulk aluminum layer 180 and the titanium-aluminum layer 190 together form the gate electrode structure 120.

As shown in FIG. 2, in some embodiments, the high-k dielectric layer 116 and the titanium-aluminum layer 190 may substantially completely fill the gate recess 114 in the insulation layer 112. Accordingly, a lower surface of the bulk aluminum layer 180 may be higher above an underlying substrate than is an upper surface of the insulation layer 112.

FIGS. 3A-3H are cross-sectional diagrams that schematically illustrate a method of forming the gate electrode 120 for the semiconductor device 100 of FIG. 2 according to certain embodiments of the inventive concepts.

Figure 3A:
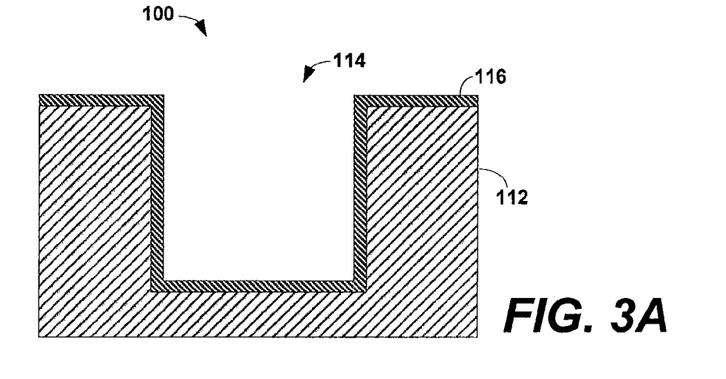
FIGS. 3A-3H are cross-sectional diagrams that schematically illustrate a method of forming a gate electrode for a semiconductor device according to certain embodiments of the inventive concepts.

Referring to FIG. 3A, a recess 114 is formed in an insulation layer 112. The insulation layer 114 may comprise, for example, any one selected from the group of $SiO_2$, SiN, or SiON. The recess 114 may be formed, for example, by removing a sacrificial gate structure (not shown). A high-k gate dielectric layer 116 may be formed on the bottom surface and sidewalls of the recess 114. The high-k dielectric layer 116 may comprise, for example, any one selected from the group consisting of HfSiON, $HfO_2$, $ZrO_2$, $Ta_2O_5$, $TiO_2$, $SrTiO_3$, $BaTiO_3$ and $SrTiO_3$.

Figure 3B:
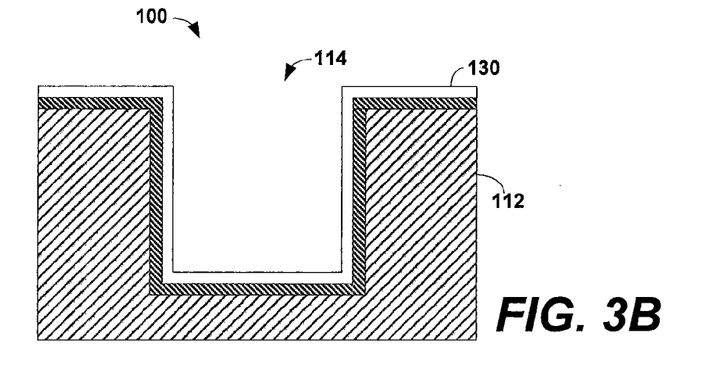

Referring to FIG. 3B, a first titanium-aluminum layer 130 is deposited in the recess 114 on the high-k dielectric layer 116. The first titanium-aluminum layer 130 may be deposited, for example, by sputtering. The first titanium-aluminum layer 130 may be a relatively thin layer having a thickness of, for example, between 30 and 120 Angstroms. In some embodiments, the first titanium-aluminum layer 130 may have a thickness of between 50 and 100 Angstroms.

Figure 3C:
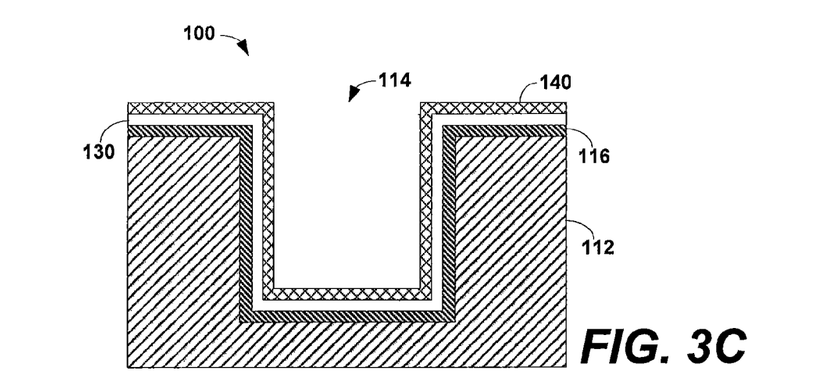

Referring to FIG. 3C, a first titanium layer 140 is deposited in the recess 114 on the first titanium-aluminum layer 130. The first titanium layer 140 may be deposited by, for example, sputtering. The first titanium layer 140 may be a relatively thin layer having a thickness of, for example, between 20 and 120 Angstroms. In some embodiments, the first titanium wetting layer 140 may have a thickness of between 30 and 90 Angstroms.

Figure 3D:
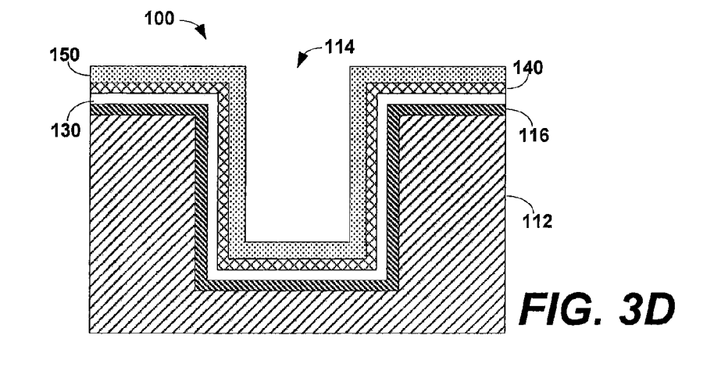

Referring to FIG. 3D, a relatively thin first aluminum layer 150 is deposited in the recess 114 on the first titanium layer 140. The first aluminum layer 150 may be deposited via, for example, sputtering. The first aluminum layer 150 may have a thickness of, for example, between 100 and 300 Angstroms. In some embodiments, the first aluminum layer 150 may have a thickness of between 120 and 240 Angstroms. In some embodiments, the thickness of the first aluminum layer 150 may be between one time and four times the thickness of the first titanium layer 140. In some embodiments, the thickness of the first aluminum layer 150 may be between two times and four times the thickness of the first titanium layer 140. In some embodiments, the thickness of the first aluminum layer 150 may be between two times and three times the thickness of the first titanium layer 140.

Figure 3E:
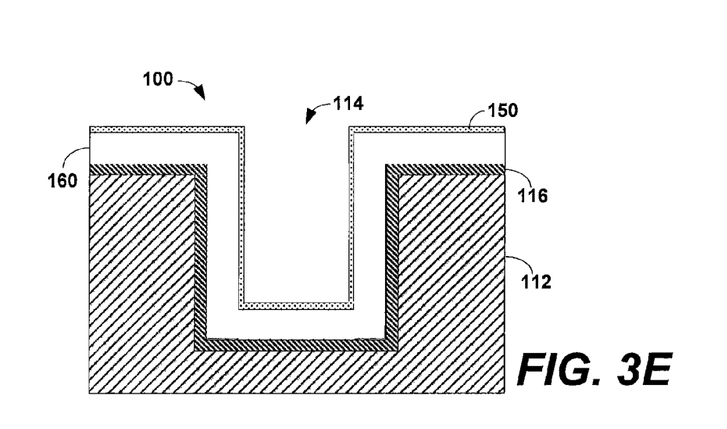

Referring to FIG. 3E, an annealing process is performed on the device. The annealing process may be carried out at a temperature that is sufficient to reflow the first titanium layer 140 and the aluminum layer 150. In an example embodiment, the annealing process may be performed at a temperature of 400° C. for 50 seconds. During the annealing process, titanium in the first titanium layer 140 diffuses into the first aluminum layer 150, and aluminum in the first aluminum layer 150 diffuses into the first titanium layer 140. Aluminum from the first aluminum layer 150 may also flow into the first titanium-aluminum layer 130. As a result of this intermixing, the first titanium-aluminum layer 130, the first titanium layer 140 and a lower portion of the first aluminum layer 150 may be converted into a second titanium-aluminum layer 160. An upper portion of the first aluminum layer 150 may remain after the anneal in some embodiments.

Figure 3F:
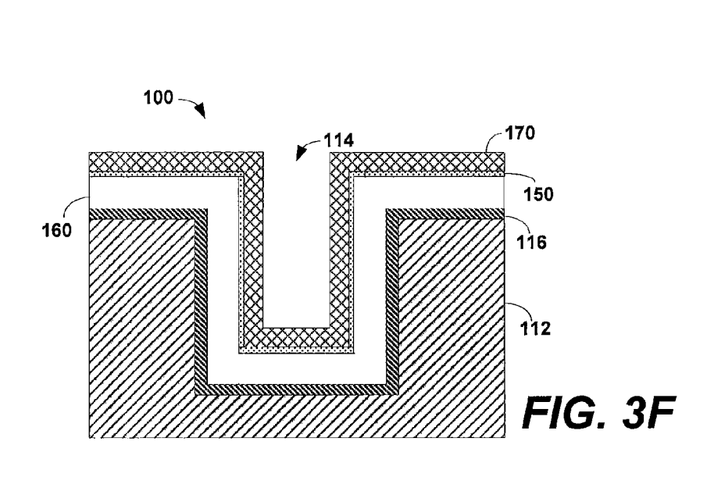

Referring to FIG. 3F, in some embodiments, a second titanium layer 170 is deposited in the recess 114 on the first aluminum layer 150 (or, in embodiments where the entirety of the first aluminum layer 150 is converted to the second titanium-aluminum layer 160, onto the second titanium-aluminum layer 160). The second titanium layer 170 may be a thin layer having a thickness, for example, of between 5 Angstroms and 60 Angstroms.

Figure 3G:
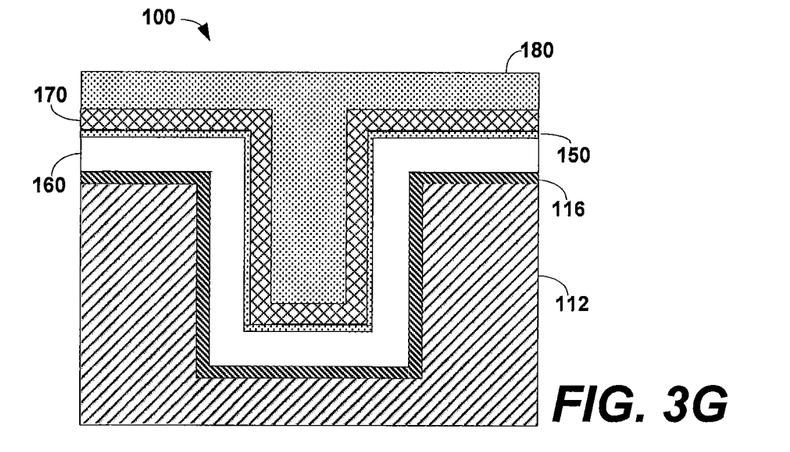

Referring to FIG. 3G, a second aluminum layer 180 is deposited in the recess 114 on the second titanium layer 170. The second aluminum layer 180 may be deposited by, for example, sputtering. The second aluminum layer 150 may substantially fill the remainder of the recess 114. The second aluminum layer 180 may be a bulk aluminum layer having a thickness of, for example, 1000 to 2000 Angstroms. The bulk aluminum layer 180 may be formed using a damascene deposition process and may be planarized to a desired height.

Figure 3H:
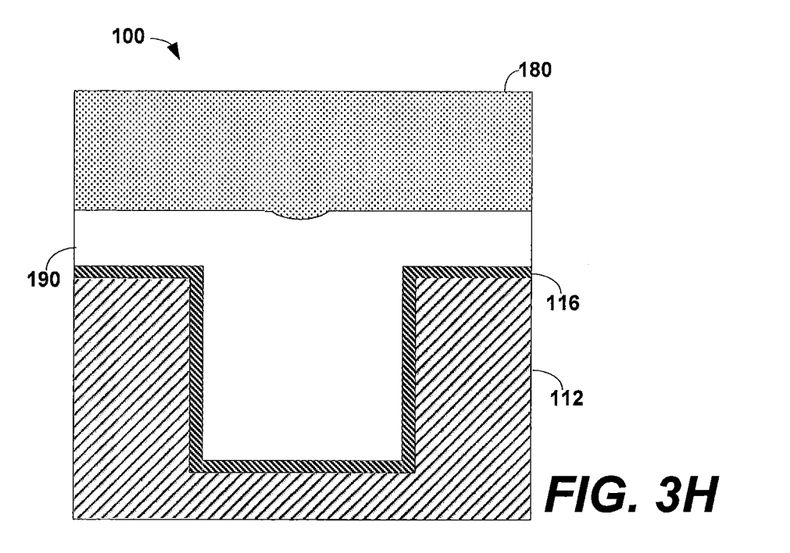

Referring to FIG. 3H, a second annealing process is performed on the device 100. The second annealing process may be carried out at a temperature that is sufficient to reflow the first and second aluminum layers 150, 180 and the second titanium layer 170. In an example embodiment, the annealing process may be performed at a temperature of 400° C. for 50 seconds. During the second annealing process, titanium in the second titanium layer 170 diffuses into the first and second aluminum layers 150 and 180, and aluminum in the first and second aluminum layers 150, 180 diffuses into the second titanium layer 170. Aluminum and/or titanium may also diffuse into the second titanium-aluminum layer 160. As a result of this intermixing, the second titanium-aluminum layer 160, the first aluminum layer 150, the second titanium layer 170, and a lower portion of the second aluminum layer 180 may be converted into third titanium-aluminum layer 190.

As shown in FIG. 3H, the third titanium-aluminum layer 190 may completely fill the recess 114. The third titanium-aluminum layer 190 may have a relatively uniform composition.

Figure 4:
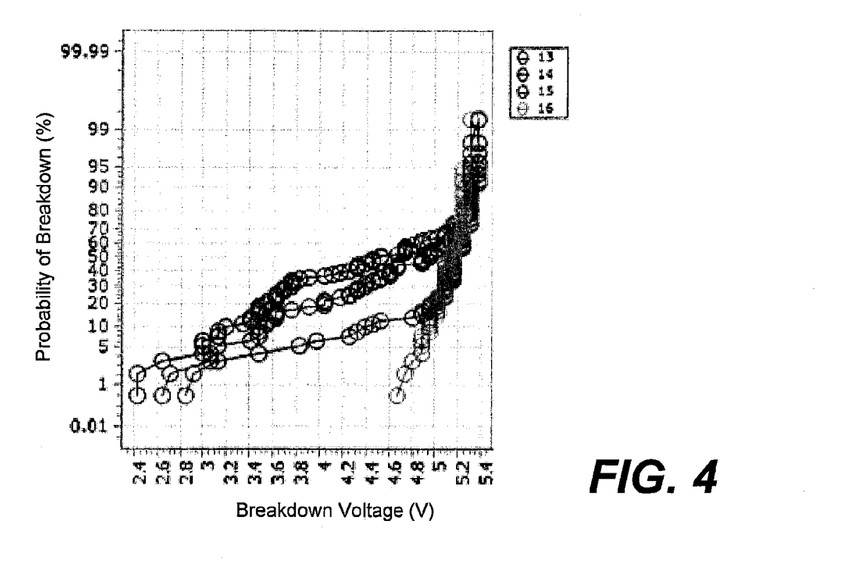
FIG. 4 is a graph illustrating the percentage of devices that achieve a range of breakdown voltages for both conventional devices and for devices fabricated according to embodiments of the inventive concepts.

FIG. 4 is a graph illustrating the probability that a device will breakdown at a given voltage that is applied across the source and drain terminals ($V_{DS}$). In the graph of FIG. 4, lines 13-15 illustrate voltage breakdown tests that were performed on transistors formed using the conventional technique described above with reference to FIGS. 1A and 1B, while line 16 illustrates voltage breakdown tests that were performed on transistors fabricated using methods according to embodiments of the inventive concepts. As shown in FIG. 4, with the transistors formed using conventional techniques, breakdown may occur at $V_{DS}$ voltages as low as 2.4 volts, and at $V_{DS}$ voltage of 4 volts the probability of breakdown ranged from 5% (line 15) to 30% (line 14). In contrast, with the transistors fabricated according to embodiments of the present invention, at $V_{DS}$ voltages of 4.7 volts the probability of breakdown is less than 1%. Thus, FIG. 4 illustrates that the techniques according to embodiments of the present invention may significantly improve the breakdown performance of transistors that include aluminum gates and titanium-aluminum work function adjustment layers.

The methods according to embodiments of the present invention may be used to form titanium-aluminum layers in recesses that have small lengths and/or relatively high aspect ratios. By way of example, the techniques disclosed herein may be used in devices fabricated according to 20 nm or smaller technologies. By way of example, transistors fabricated using the methods disclosed herein may have metal gate electrode structures having lengths of about 20 nm to about 2000 nm, widths of about 50 nm to about 4000 nm and depths of about 20 nm to about 40 nm. The directions corresponding to the above-referenced lengths, widths and depths are labeled in FIG. 2. As shown in FIG. 2, the width and length are measured along perpendicular directions in a plane that is parallel to the top surface of an underlying substrate, and the depth is measured in a direction that is perpendicular to the top surface of the substrate. The width may be smaller, larger or equal to the length. The height-to-length aspect ratio of the recess may be 2:1 or more in some embodiments. In some embodiments, the height-to-length aspect ratio may be between 4:1 and 1:2.

With recesses having these dimensions, conventional PVD and/or RF PVD deposition techniques may not effectively fill the recesses. As such, other deposition techniques such as sputtering may be used. However, with recesses having these dimensions, it may be difficult to effectively fill the recess with sputtered aluminum and/or with sputtered titanium-aluminum, due to pinch-off. These recesses may be more effectively filled by first sputtering a thin titanium-aluminum layer, followed by a thin titanium wetting layer in the recess, and then further sputtering a bulk aluminum layer to fill the remainder of the recess. This approach, however, can lead to non-uniform titanium-aluminum formation such that the titanium-aluminum barrier layer may have thin regions which may allow pure aluminum to diffuse through the titanium-aluminum layer and into the underlying dielectric layers. When this occurs, the breakdown voltage of the device may be significantly degraded.

In some embodiments, the titanium aluminum layers may be formed in an aluminum starvation mode where the thickness of the first aluminum layer 150 is less than a thickness that is necessary to achieve the 1:3 TiAl ratio that will tend to naturally occur during the formation of the second titanium-aluminum layer 160. This may be accomplished, for example, by forming the first aluminum layer 150 as a thin layer that has a thickness that is, for example, less than three times the thickness of the first titanium layer 140. For example, in some embodiments, the first aluminum layer 150 may have a thickness of between two and three times the thickness of the first titanium layer 140. Because of the limited supply of aluminum, the reaction between the titanium and aluminum will tend to occur laterally along the interface between the titanium and aluminum layers 140, 150. By forming the second titanium-aluminum layer 160 in an aluminum starvation mode it is possible to achieve more uniform titanium-aluminum formation to provide a second titanium-aluminum layer 160 that may block diffusion of aluminum into the underlying dielectric layers 112, 116.

In other embodiments, the thickness of the first aluminum layer 150 may be more than three times greater than the thickness of the first titanium layer 140. In such embodiments, the first aluminum layer 150 may still be much thinner than the second aluminum layer 180 that is formed on the titanium layer when conventional fabrication techniques are used. Additionally, in such embodiments a second titanium layer 170 may be formed on the first aluminum layer 150, either before or after the first annealing process is performed. This second titanium layer 170 may effectively encapsulate the first aluminum layer 150 and may allow the conversion of the first aluminum layer 150 into a titanium-aluminum layer to occur from both sides of the first aluminum layer 150. This may further increase the uniformity of the resultant titanium-aluminum layer. This may also increase the thickness of the titanium-aluminum layer, and the thicker layer may be more effective at reducing or preventing diffusion of aluminum into the underlying dielectric layers 112, 116. In embodiments where a second titanium layer 170 is deposited on top of the first aluminum layer 150, the second titanium layer 170 may serve as a seed layer for the deposition of the bulk second aluminum layer 180, which may enhance the ability of the second aluminum layer 180 to fill any remaining portion of the recess 114.

Figure 5:
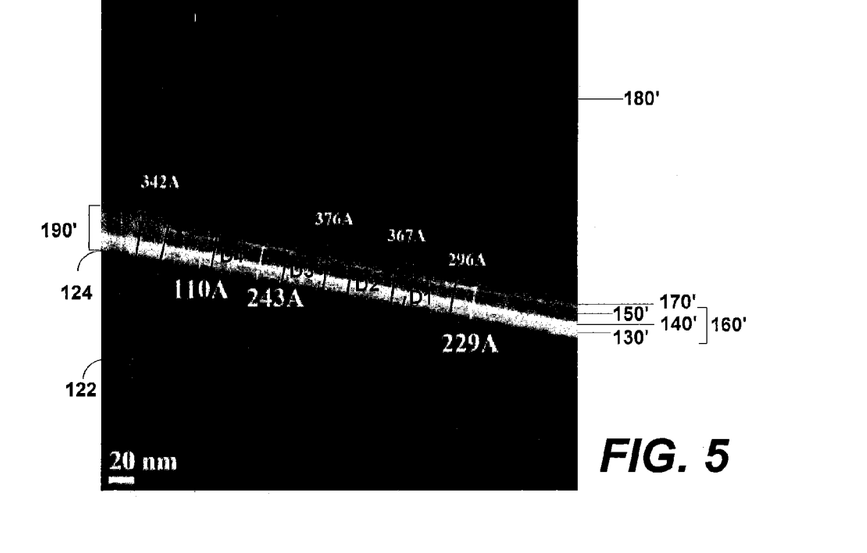
FIG. 5 is a TEM photograph illustrating a titanium-aluminum layer fabricated according to embodiments of the inventive concepts.

FIG. 5 is a TEM photograph illustrating a titanium-aluminum layer fabricated according to embodiments of the inventive concepts. FIG. 5 may be compared to the titanium-aluminum layer of FIG. 2 that was fabricated using conventional techniques to show the increased uniformity of the titanium-aluminum layers formed using the methods according to embodiments of the inventive concepts.

Referring to FIG. 5, a tantalum-nitride barrier layer 124 was formed on a silicon substrate 122. A first titanium-aluminum layer 130' was formed on the tantalum-nitride barrier layer 124. A first titanium layer 140' was formed on the first titanium-aluminum layer 130', and then a first aluminum layer 150' was formed on the titanium-aluminum layer 140'. An annealing process was performed to convert the first titanium-aluminum layer 130', the first titanium layer 140' and the lower portion of the first aluminum layer 150' into a second titanium-aluminum layer 160'. A second titanium layer 170' was then formed on the remaining portion of the first aluminum layer 150', and a second, bulk aluminum layer 180' was then deposited on the second titanium layer 170'. The device was annealed again to convert the second titanium-aluminum layer 160', the remainder of the first aluminum layer 150', the second titanium layer 170' and a lower portion of the second (bulk) aluminum layer 180' into a third titanium-aluminum layer 190'. In FIG. 5, primes are included on reference numerals 130', 140', 150', 160', 170', 180' and 190' as these layers are formed on a flat tantalum nitride layer 124 as opposed to in a recess and hence differ in that respect from corresponding layers 130, 140, 150, 160, 170, 180 and 190 as shown in FIGS. 3A-3H.

As can be seen in the TEM image of FIG. 5, the third titanium-aluminum layer 190' is much more uniform than the titanium-aluminum layer shown in the TEM of FIG. 1D. In particular, as can be seen in FIG. 5, the concentration of titanium in the third titanium-aluminum layer 190' is substantially uniform at each distance above a top surface of the underlying tantalum-nitride barrier layer 124. This can be seen by the fact that a series of stripes are formed on top of the tantalum-nitride barrier layer 124 that are generally constant in color, representing that within the stripe, the titanium concentration is relatively uniform.

Figure 6:
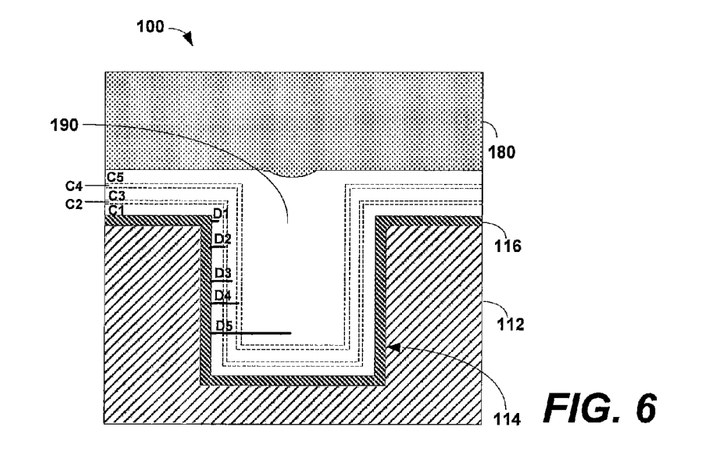
FIG. 6 is a schematic cross-sectional diagram that illustrates how the titanium-aluminum layer may have stripes with relatively uniform titanium concentration levels at the different distances from the underlying high-k dielectric layer.

As is also readily apparent from FIG. 5, the concentration of titanium in the third titanium-aluminum layer 190' varies as a function of distance from the top surface of the underlying layer structure. In particular, at a first distance D1 from a top surface of the tantalum-nitride barrier layer 124 the third titanium-aluminum layer has a first titanium concentration C1. At a second distance D2 from the top surface of the tantalum-nitride barrier layer 124 the third titanium-aluminum layer has a second titanium concentration C2 that exceeds the first titanium concentration C1. At a third distance D3 from the top surface of the tantalum-nitride barrier layer 124 the third titanium-aluminum layer has a third titanium concentration C3 that is less than the second titanium concentration C2 and less than the first titanium concentration C1. At a fourth distance D4 from the top surface of the tantalum-nitride barrier layer 124 the third titanium-aluminum layer has a fourth titanium concentration C4 that is less than the second titanium concentration C2 but that exceeds the first and third titanium concentrations C1 and C3. At a fifth distance D5 from a top surface of the tantalum-nitride barrier layer 124 the third titanium-aluminum layer has a fifth titanium concentration C5 that is less than the first, second and fourth titanium concentrations C1, C2 and C4 and approximately equal to the third titanium concentration C3. FIG. 6 schematically illustrates how the third titanium-aluminum layer 190 may have stripes with relatively uniform titanium concentration levels at the different distances D1-D5 from the underlying high-k dielectric layer 116.

As can also be seen in FIG. 5, because the third titanium-aluminum layer 190' in FIG. 5 has a relatively uniform titanium concentration at each fixed distance above the tantalum nitride layer 124, the breaks in the titanium-rich regions that are present in the TEM image of FIG. 1D are generally absent in the TEM image of FIG. 5, and the plumes of titanium 26' that are present in the TEM image of FIG. 1D are also mostly absent in the TEM image of FIG. 5.

CMOS transistors refer to structures that include both an n-type MOSFET transistor and a p-type MOSFET transistor that are formed on the same substrate. CMOS transistors are used in a wide variety of applications. Aluminum gates and titanium-aluminum work function adjusting layers are often included in n-type MOSFET transistors that include a high-k gate dielectric layer. The titanium-aluminum work function adjusting layer may also be included in the gate electrode layer structure for the p-type device in order to simplify the manufacturing process. However, diffusion of aluminum into the high-k dielectric layer may be more likely with the p-type device. As noted above, when this occurs, it can negatively impact the breakdown voltage and threshold voltage performance of the transistor.

Pursuant to embodiments of the present invention, methods are provided for forming a more uniform titanium-aluminum work function adjusting layer in gate recesses. These methods may be used, for example, in 20 nm and smaller processing technologies. The more uniform titanium-aluminum work function adjusting layers may reduce or prevent diffusion of aluminum into the underlying insulating layers (e.g., a high-k gate dielectric layer) on both the NMOS and PMOS sides of these devices, thereby improving the performance and/or production yields for these devices.

Figure 7:
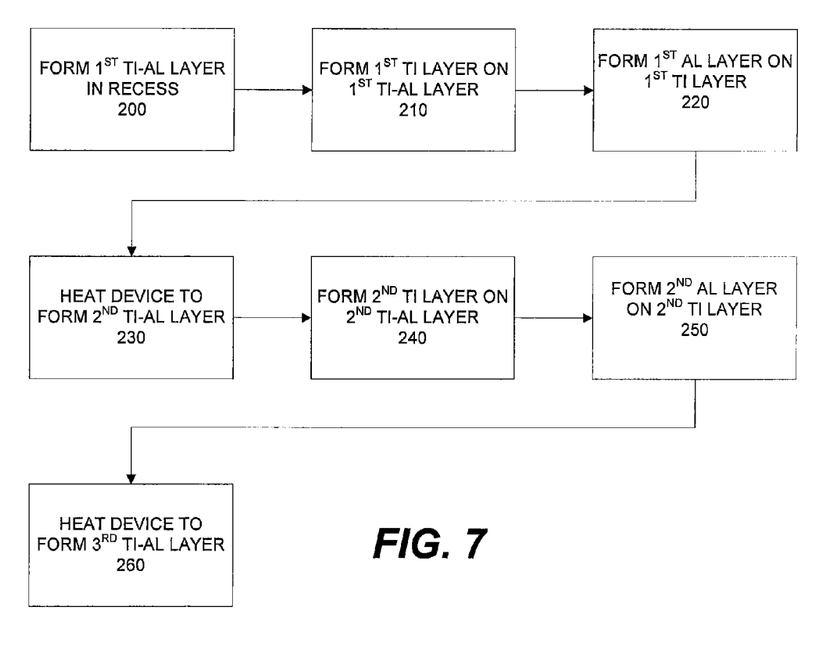
FIG. 7 is a flow chart of a method of forming a gate electrode for a semiconductor device according to certain embodiments of the inventive concepts.

FIG. 7 is a flow chart of a method of forming a gate electrode structure for a semiconductor transistor according to certain embodiments of the inventive concepts.

As shown in FIG. 7, operations begin with the formation of a first titanium-aluminum layer in a recess (Block 200). The first titanium-aluminum layer may be conformally formed on sidewalls and a bottom surface of the recess in some embodiments. The recess may be a recess in an insulation layer. Moreover, one or more other layers may be formed in the recess prior to the formation of the first titanium-aluminum layer. For example, in some embodiments, a high-k gate dielectric layer and/or a titanium nitride barrier layer may be formed in the recess prior to the formation of the first titanium-aluminum layer. Next, a first titanium layer is formed in the recess on top of the first titanium-aluminum layer (Block 210). The first titanium layer may be conformally formed on the first titanium-aluminum layer in some embodiments. Then, a first aluminum layer is formed in the recess on top of the first titanium layer (Block 220). The first aluminum layer may be conformally formed on the first titanium layer in some embodiments. The first titanium-aluminum layer, the first titanium layer and the first aluminum layer may together comprise a first preliminary gate electrode structure. The first preliminary gate electrode structure may not completely fill the recess.

Next, the first preliminary gate electrode structure may be heated to a temperature sufficient to convert the first titanium-aluminum layer, the first titanium layer and at least some of the first aluminum layer into a second titanium-aluminum layer (Block 230). Then, a second titanium layer may be formed in the recess on top of the second titanium-aluminum layer (Block 240). The second titanium layer may be conformally formed on a remaining upper surface of the first aluminum layer in some embodiments. Then, a second aluminum layer that is thicker than the first aluminum layer is formed on top of the second titanium layer to form a second preliminary gate structure (Block 250). The second aluminum layer may fill the remainder of the recess. Then, the second preliminary gate structure is heated to convert the second titanium-aluminum layer, any remaining portion of the first aluminum layer, the second titanium layer and a lower portion of the second aluminum layer into a third titanium-aluminum layer (Block 260). The third titanium-aluminum layer and the remainder of the second aluminum layer may comprise a gate electrode structure for a transistor. The gate electrode structure may be patterned as appropriate.

It will be appreciated that numerous changes may be made to the above-described embodiments without departing from the scope of the present invention. By way of example, in still further embodiments, the embodiment described with reference to FIGS. 3A-3H may be modified so that the second titanium layer 170 may be formed on the first aluminum layer 150 prior to the first annealing step. This allows the first aluminum layer 150 (along with the first titanium-aluminum layer 130) to be converted into the second titanium-aluminum layer 160 from both sides of the first aluminum layer 150. In such embodiments, a third titanium layer may be formed on the second titanium layer 160 prior to formation of the second (bulk) aluminum layer 180, or the third titanium layer may be omitted.

As another example, the second annealing step may be performed after formation of the second titanium layer 170 in the embodiment of FIGS. 3A-3H but prior to the formation of the second (bulk) aluminum layer 180. In such embodiments, the thickness of the second titanium layer 170 may be selected so that the entirety of the second titanium layer 170 is converted during the second annealing step into titanium-aluminum or so that only a lower portion of the second titanium layer 170 is converted into titanium-aluminum. In such embodiments, a third annealing step may be performed after the second (bulk) aluminum layer 180 is formed on the structure after completion of the second annealing step.

Embodiments of the inventive concepts have been described above with reference to the accompanying drawings, in which example embodiments are shown. The inventive concepts may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout the drawings and specification. As used herein the expression "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

It will be understood that when an element is referred to as being "coupled to" or "connected to" or "on" another element, it can be directly coupled to, connected to or on the other element or intervening elements may also be present. In contrast, when an element is referred to as being "directly coupled to" or "directly connected to" or "directly on" another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, elements, and/or components, but do not preclude the presence or addition of one or more other features, elements, components, and/or groups thereof.

Embodiments of the inventive concepts have been described above with reference to cross-section illustrations that are schematic illustrations of idealized embodiments (and intermediate structures) of the inventive concepts. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

All embodiments can be combined in any way and/or combination.

In the drawings and specification, there have been disclosed typical embodiments of the inventive concepts and, although specific terms are employed, they are used in a generic and descriptive sense only and not for purposes of limitation, the scope of the inventive concepts being set forth in the following claims.

What is claimed is:

1. A method of forming a semiconductor device, comprising:
   forming a first titanium-aluminum layer in a recess;
   forming a first titanium layer in the recess on the first titanium-aluminum layer;
   forming a first aluminum layer in the recess on the first titanium layer to form a first preliminary gate electrode structure in the recess;
   heating the first preliminary gate electrode structure to a temperature sufficient to convert the first titanium-aluminum layer, the first titanium layer and at least a lower portion of the first aluminum layer into a second titanium-aluminum layer;
   forming a second aluminum layer that is thicker than the first aluminum layer on the second titanium-aluminum layer to form a second preliminary gate electrode structure;
   forming a second titanium layer in the recess on the second titanium-aluminum layer prior to forming the second aluminum layer; and
   heating the second preliminary gate electrode structure to convert the second titanium-aluminum layer, any remaining portion of the first aluminum layer, the second titanium layer and a lower portion of the second aluminum layer into a third titanium-aluminum layer to convert the second preliminary gate electrode structure into a gate electrode structure.

2. The method of claim 1, wherein the second titanium layer substantially fills a remainder of the recess.

3. The method of claim 1, wherein the recess is in an insulation layer, and wherein an entirety of an upper surface of the third titanium-aluminum layer is at a height above an underlying substrate that exceeds a maximum height of the insulation layer above the underlying substrate.

4. The method of claim 1, wherein heating the first preliminary gate electrode structure to the temperature sufficient to convert the first titanium-aluminum layer, the first titanium layer and at least some of the first aluminum layer into a second titanium-aluminum layer only converts the first titanium-aluminum layer, the first titanium layer and the lower portion of the first aluminum layer that is adjacent the first titanium layer into the second titanium-aluminum layer.

5. The method of claim 4, wherein the first titanium layer is formed directly on an upper surface of the first titanium-aluminum layer, the first aluminum layer is formed directly on an upper surface of the first titanium layer, the second titanium layer is formed directly on an upper surface of the remaining portion of the first aluminum layer, and the second aluminum layer is formed directly on an upper surface of the second titanium layer.

6. The method of claim 1, further comprising forming a dielectric layer in the recess that has a dielectric constant that exceeds a dielectric constant of silicon oxide prior to forming the first titanium-aluminum layer in the recess.

7. The method of claim 6, wherein after the dielectric layer is formed in the recess, a remainder of the recess defines an opening having a length in a first direction that is parallel to an upper surface of an underlying substrate that is less than about 20 nm, and wherein the opening has a depth in a second direction that is parallel to the first direction and perpendicular to the upper surface of the substrate, wherein the depth is at least twice the length.

8. The method of claim 6, wherein, within the recess, a concentration of titanium in the third titanium-aluminum layer is substantially uniform at each distance from a top surface of the dielectric layer.

9. The method of claim 8, wherein, within the recess, the concentration of titanium in the third titanium-aluminum layer varies as a function of distance from the top surface of the dielectric layer.

10. The method of claim 8, wherein, within the recess, the third titanium-aluminum layer has a first titanium concentration at a first distance from the top surface of the dielectric layer, a second titanium concentration at a second distance from the top surface of the dielectric layer and a third titanium concentration at a third distance from the top surface of the dielectric layer, wherein the third distance is greater than the second distance and the second distance is greater than the first distance, and wherein the second concentration exceeds both the first concentration and the third concentration.

11. The method of claim 1, wherein the first aluminum layer has a thickness that is no more than three times greater than a thickness of the first titanium layer.

12. The method of claim 1, wherein the first aluminum layer has a thickness that is between two and four times greater than a thickness of the first titanium layer, and wherein the second titanium layer has a thickness that is less than the thickness of the first titanium layer.

13. The method of claim 1, wherein the first titanium-aluminum layer, the first titanium layer and the first aluminum layer are each formed via sputtering.

14. The method of claim 1, wherein a bottom of the recess comprises an insulating layer and the first titanium-aluminum layer is formed directly on the insulating layer.

15. A method of forming a semiconductor device, comprising:
   forming a first titanium-aluminum layer in a recess;
   forming a first titanium layer in the recess on the first titanium-aluminum layer;
   forming a first aluminum layer in the recess on the first titanium layer to form a first preliminary gate electrode structure in the recess;
   heating the first preliminary gate electrode structure to a temperature sufficient to convert the first titanium-aluminum layer, the first titanium layer and at least a lower portion of the first aluminum layer into a second titanium-aluminum layer;
   forming a second aluminum layer that is thicker than the first aluminum layer on the second titanium-aluminum layer to form a second preliminary gate electrode structure; and
   heating the second preliminary gate electrode structure to convert the second titanium-aluminum layer, any remaining portion of the first aluminum layer and a lower portion of the second aluminum layer into a third titanium-aluminum layer to convert the second preliminary gate electrode structure into a gate electrode structure.

16. A method of forming a semiconductor device, comprising:
- forming a first titanium layer in a recess in an underlying layer structure having at least one layer;
- forming a first aluminum layer in the recess on an upper surface of the first titanium layer to form a first preliminary gate electrode structure, the first aluminum layer having a thickness that is less than three times a thickness of the first titanium layer;
- heating the first preliminary gate electrode structure to a temperature sufficient to convert the first titanium layer and at least a lower portion of the first aluminum layer into a second titanium-aluminum layer;
- forming a second aluminum layer that is thicker than the first aluminum layer on the second titanium-aluminum layer to form a second preliminary gate electrode structure; and
- heating the second preliminary gate structure to convert the second titanium-aluminum layer, any remaining portion of the first aluminum layer, and a lower portion of the second aluminum layer into a third titanium-aluminum layer.

17. The method of claim 16, further comprising forming a first titanium-aluminum layer in the recess prior to forming the first titanium layer, wherein the first titanium-aluminum layer comprises part of the first preliminary gate electrode structure and is converted during the heating of the first preliminary gate electrode structure into part of the second titanium-aluminum layer.

* * * * *